United States Patent [19]

Ma

[11] 3,818,349

[45] June 18, 1974

[54] THICK FILM VHF TUNER WHEREIN UHF SUBCHASSIS IS USED AS EXTERNAL GROUND ELEMENT FOR VHF TUNER

[75] Inventor: John Ma, Glenview, Ill.

[73] Assignee: Zenith Radio Corporation, Chicago, Ill.

[22] Filed: Oct. 1, 1973

[21] Appl. No.: 402,512

[52] U.S. Cl. ......... 325/352, 317/101 C, 317/101 D, 325/458, 325/459, 334/1, 334/15, 334/44

[51] Int. Cl. ........................................... H04b 1/08

[58] Field of Search .............. 334/1, 15, 44, 45, 41; 317/101 C, 101 D, 101 DH; 325/318, 352, 355, 357, 458, 459, 445

[56] References Cited

UNITED STATES PATENTS

| | | | |
|---|---|---|---|
| 3,651,409 | 3/1972 | George et al. | 334/15 X |
| 3,659,205 | 4/1972 | Cooke et al. | 325/445 |

FOREIGN PATENTS OR APPLICATIONS

| | | | |
|---|---|---|---|
| 1,197,073 | 7/1970 | Great Britain | 334/15 |

*Primary Examiner*—Paul L. Gensler
*Attorney, Agent, or Firm*—Nicholas A. Camasto; John J. Pederson

[57] ABSTRACT

A television tuner has a UHF section comprising a stamped metal subchassis forming a plurality of resonant circuit elements whose electrical characteristics are adjustable by deforming portions thereof and a thick film integrated circuit VHF section comprising a nonconductive substrate upon which a plurality of resistive, conductive and capacitive circuit elements are formed by resistive, conductive and dielectric materials deposited in predetermined patterns. A number of discrete components are directly connected to both the UHF and VHF sections. A shielded metal housing supports the stamped metal subchassis and thick film integrated circuit. A plurality of mounting fingers comprising extensions of the stamped subchassis form electrical and mechanical connections to the thick film integrated circuit resiliently supporting it and permitting the subchassis to function as an external ground element therefor.

10 Claims, 5 Drawing Figures

THICK FILM VHF TUNER WHEREIN UHF SUBCHASSIS IS USED AS EXTERNAL GROUND ELEMENT FOR VHF TUNER

RELATED PATENT APPLICATIONS

This application is related to applications Ser. No. 301,706 filed Oct. 27, 1972 entitled "A UHF VARACTOR TUNER HAVING A CHASSIS OF UNITARY CONSTRUCTION" in the name of John Buckley and John Ma, Ser. No. 402,522 filed Oct. 1, 1973 entitled "Thick Film Feed through Capacitor" in the name of John Ma, and Ser. No. 410,937 filed Oct. 29, 1973 entitled "Tuner With Integral Input Filter" in the name of John Ma. All of the applications are assigned to the assignee of the present application and disclose separate and distinct inventions having preferred embodiments related to the present invention.

BACKGROUND OF THE INVENTION

Television tuners convert the frequency of a received signal to an intermediate frequency by a heterodyning process. Heterodyning consists of generating an oscillator signal and applying it, together with a received signal, to a mixer and recovering the resultant difference, or beat frequency, signal. By changing the oscillator frequency, received signals of different frequencies over a relatively wide frequency range may be converted to a common desired intermediate frequency.

The specific types of circuitry used in television tuners vary but all tuners include an RF amplifier stage, a variable frequency local oscillator stage, and a mixer stage. In most tuners mechanical switching arrangements selectively interchange different resonant circuit elements for varying the local oscillator frequency (and the resonant frequencies of other tuned stages). In general, tuner performance has been satisfactory but mechanical type tuners require a large number of components with resultant problems of repeatability, reliability, expense, difficulty of manufacture, and bulkiness.

Recently varactor tuners, which are distinctly different from mechanical tuners, have been gaining acceptance by television manufacturers and the viewing public. These tuners incorporate varactor diode semiconductor devices which exhibit capacity variations with changes in applied DC control voltage. Thus, such tuners not only offer size advantages but are readily controllable by a DC voltage, rather than requiring the interchange of elements in resonant circuits.

From a manufacturing point of view, it is highly desirable that the characteristics of tuners be repeatable, that is, that each tuner be similar in performance. Because of the high frequency of the signals processed by tuners, the spacing of components and wiring is critical and variations therein may produce gross variations in tuner characteristics. Close spacing of discrete circuit components also may produce undesirable signal coupling which increases the probability of spurious resonances and interferences which degrade performance.

The size problem is not as serious as the others although it is desirable to make a tuner compact to minimize the distances over which the low level high frequency signals must be translated. Also from a packaging point of view, a compact unit is much to be preferred and yields numerous advantages to the television stylist.

Tuner reliability is, of course, directly related to the number of components used, as is true of component cost and overall tuner size. Further, manufacturing difficulty increases with an increased number of components.

The invention provides a novel VHF tuner of high reliability, low cost, reduced size, and consistent characteristics which incorporates a ceramic-based thick film integrated circuit to which discrete components are mounted and soldered in automated processes similar to those currently used for printed circuit boards and components. As will be seen, the thick film integrated circuit mounting arrangement enables a compact, rugged, and easy to manufacture VHF assembly, and in combination with the novel UHF chassis construction described and claimed in the above-mentioned Buckley and Ma copending application, yields a very attractive combination VHF-UHF tuner.

OBJECTS OF THE INVENTION

Accordingly, it is an object of the present invention to provide an improved television tuner.

It is a further object of the present invention to provide a rugged, more reliable, compact and easy to manufacture television tuner.

SUMMARY OF THE INVENTION

A VHF television tuner includes a thick film integrated circuit having a substrate, on which a plurality of resistive and capacitive components and their conductive interconnections have been deposited in a layer-like configuration. The substrate includes an elongate large area ground plane of deposited conductive material serving as the ground for a number of the deposited components carrying high frequency currents. The tuner RF amplifier and mixer stages are located adjacent the ground plane. Certain of the deposited components carry high frequency currents and have one terminal defined by the ground plane and their other terminals connected to large area conductive elements. An external metal ground element is connected to the ground plane at a plurality of points.

BRIEF DESCRIPTION OF THE DRAWINGS

The features of this invention which are believed to be novel are set forth with particularity in the appended claims. The invention, together with its further objects and advantages, may best be understood by reference to the following description taken in conjunction with the accompanying drawings in the several figures of which like reference numerals refer to like elements and in which:

DETAILED DESCRIPTION OF THE PREFERRED EMBODIMENT

Figure 1:
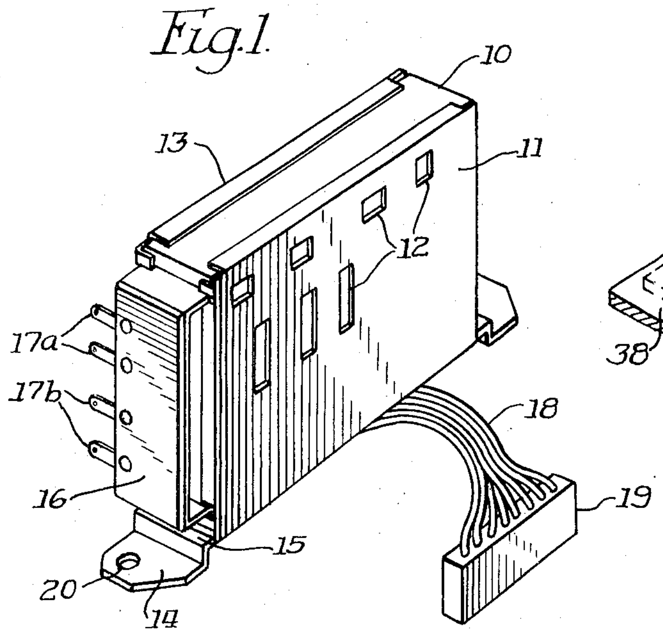
FIG. 1 shows a perspective view of a television tuner in accordance with the disclosed invention.

Referring to FIG. 1, a generally rectangular open metal housing 10, supporting tuner circuitry (not shown), includes a pair of mounting flanges 14 having mounting holes 20. A cover 11 of suitable electromagnetic energy shielding properties encloses one side of housing 10. Cover 11 has a plurality of access holes 12 which, as will be described later, permit adjustment of the enclosed tuner circuitry. Another shielding cover 13 encloses the opposite side of housing 10 and may also contain access holes similar to those in cover 11. An input terminal bracket 15 is mounted to housing 10 and supports an input terminal circuit board 16. Two sets of input terminals, 17*a* and 17*b*, suitable for connection to sources of UHF and VHF television signals together with input antenna balun coils (not shown) are mounted to the circuit board. The circuit board may include printed conductive connections and may also include printed type balun coils.

The enclosed tuner circuitry includes an FM and IF filter network, an RF amplifier, a mixer, and a local oscillator. The FM and IF filter network reduces any information present in the input signal at FM broadcast frequencies which are between 88 and 108 MHz and at the television IF frequency of 45.75 MHz before coupling it to the RF amplifier for amplification. The local oscillator supplies the required signal to the mixer which also receives the amplified input signal and produces the desired IF frequency signal by the familiar heterodyning action. An interstage transformer is generally included for reducing the source impedance of the mixer and for coupling the IF signal to an output connector. The resonant frequencies of the RF amplifier, mixer and local oscillator stages are adjusted to tune the selected television broadcast signal by applying appropriate DC control voltages to the respective varactor diode-tuned resonant circuits within these stages. A plurality of wires 18 connect to the tuner circuitry in housing 10 for supplying the control voltages to the varactor diodes and operating potentials to the tuner. The wires terminate in a suitable connecting plug 19 for facilitating use of the tuner with a television receiver (not shown).

It will be recognized that the entire VHF-UHF tuner is enclosed and shielded by housing 10 and covers 11 and 13. In particular, those skilled in the art will note that the FM and IF filter network was recited as being within housing 10. In the past, the practice has been to incorporate a separate shielded FM and IF filter because of the need to align the tuner (on the production line) apart from the filter. As described and claimed in the above copending application Ser. No. 410,937, Applicant's invention enables the filter to be incorporated on the VHF substrate and provides for a totally enclosed VHF-UHF combination tuner. It will be understood, however, that, for the purposes of the instant invention, the filter may be placed outside of the housing and not integrated on the VHF thick film substrate.

As is well known, feed-through capacitors are used to bring in operating and control voltages to a tuner to prevent extraneous signals being coupled to or from the tuner. Such conventional feed-through capacitors may, of course, be used in the described tuner. However, it is preferable that novel deposited type feed-through capacitors be used. Such deposited feed-through capacitors are the subject of the above-mentioned related application Ser. No. 402,522 and are fully described and claimed therein. However, suffice it to say here that the feed-through capacitors provide high frequency filtering at each connection point.

Figure 2:
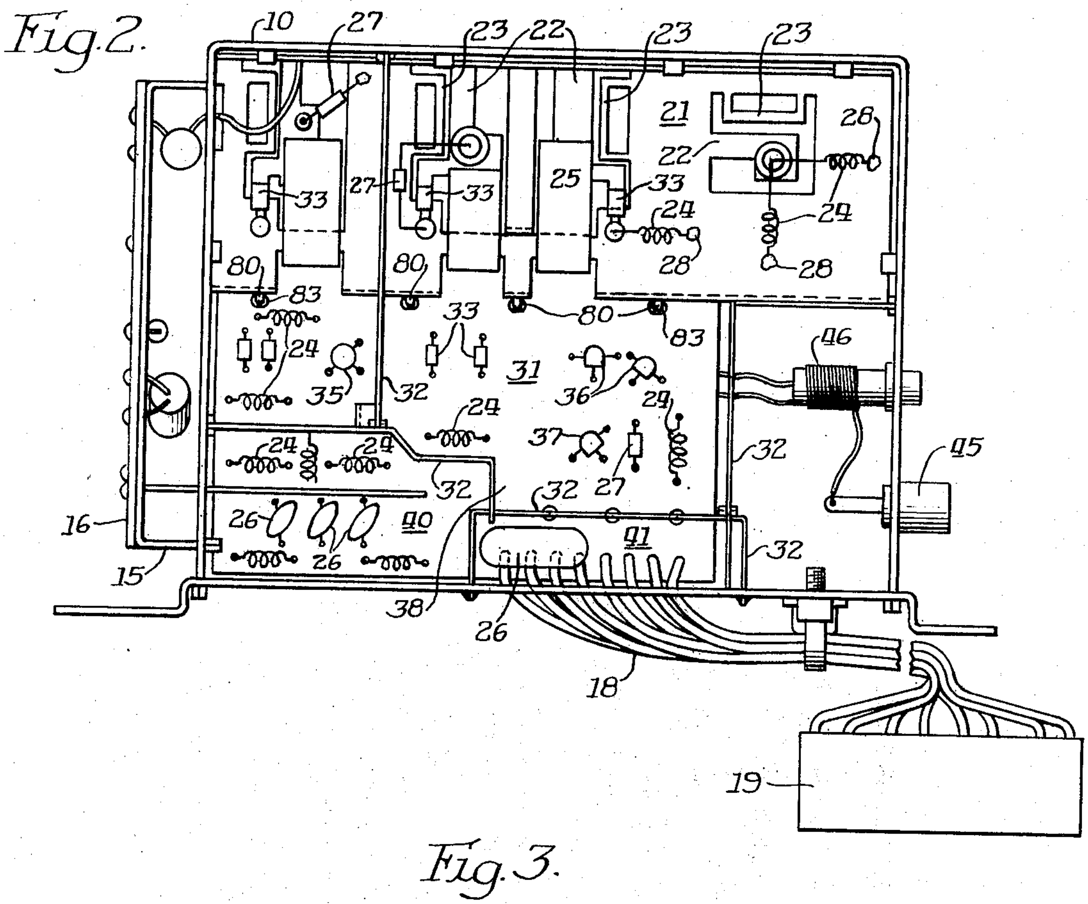
FIG. 2 is a view of the tuner with one cover shield removed to disclose the stamped UHF section and the discrete component side of the VHF thick film circuit.

As shown in FIG. 2, a stamped metal UHF subchassis 21 forms a plurality of adjustable tuned elements, the electrical characteristics of which may be varied by deforming certain portions of subchassis 21. Subchassis 21 is the subject of the referent application to Buckley and Ma which discloses a unitary stamped, essentially planar, metal structure forming transmission inductors, capacitors and tunable inductive shunts. The capacitors comprise tabs which are bent to an overlying position in close proximity to the chassis plane, the resulting capacitance being a function of the tab area and distance from the chassis plane. The capacitor is "trimmable" by changing the tab spacing. The transmission inductors comprise essentially straight elements cut in the subchassis and tunable inductive shunts of generally smaller "U" shaped portions of the subchassis adjacent the straight elements. The inductance is changed by bending the inductive shunt, thus changing its positioning with respect to the straight element.

For example, capacitor 25 is adjustable by moving its upper plate closer to or farther from the corresponding opposite plate formed in the subchassis. Similarly, the inductances of inductors 22 are varied by changing the proximity of their respective adjacent shunts 23. These adjustments can be made through the access holes in the tuner covers. A plurality of discrete circuit components including inductors 24, capacitors 26, resistors 27 and varactor diodes 33 are mounted to subchassis 21 by solder connections and coact with the stamped circuit elements.

A VHF thick film integrated circuit 31 includes an alumina substrate 38 which supports a number of discrete circuit components 24, 26 and 27 together with a plurality of varactor diodes 33, and an RF amplifier stage including a transistor 35, a mixer stage including a pair of transistors 36, and a local oscillator stage including a transistor 37. The RF amplifier and mixer stages are positioned near the inner edge of UHF subchassis 21. As will be discussed later in greater detail, the area of substrate 38 beneath this subchassis edge supports a VHF ground plane and the placement of the RF amplifier and mixer stages in close proximity to it is advantageous.

An isolation shield 32 having a number of segmenting portions is used to reduce coupling between adjacent circuit areas, and is electrically and mechanically connected to housing 10. The shield defines a plurality of electrically isolated cavities housing FM and IF filter network 40, the RF amplifier stage, the mixer and local oscillator stages, an interstage transformer 46, and feed-through input connections 41. Interstage transformer 46 is mounted to housing 10 in any convenient manner and couples the mixer output signal to an output connector 45 at an impedance suitable for driving the IF amplifier of a television receiver. UHF subchassis 21 is connected electrically and mechanically to VHF thick film circuit 31 by a plurality of mounting fingers 80, which extend from subchassis 21, through appropriately located holes 83 in substrate 38, and are soldered to conductive material deposited on its bottom side.

Figure 3:
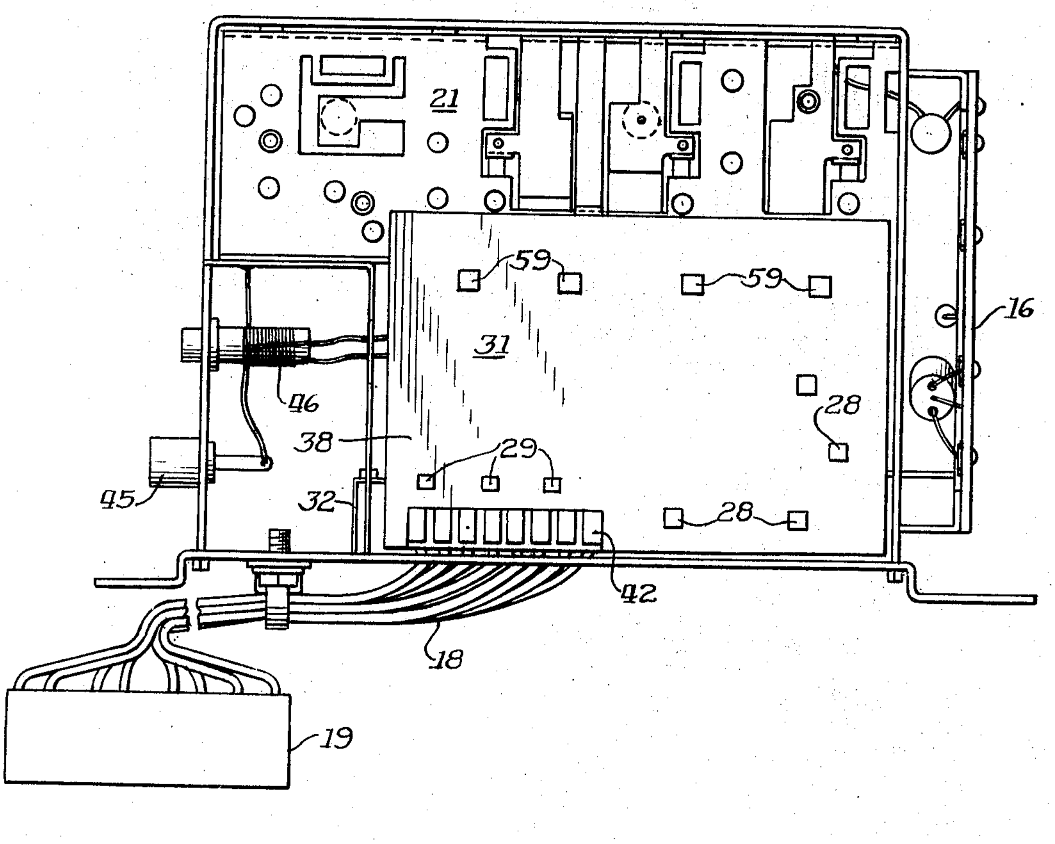
FIG. 3 is a view of the tuner with the other cover shield removed to disclose the other side of the stamped UHF section and the VHF thick film circuit.

FIG. 3 shows the tuner with cover 13 removed and solder connections 59 which represent the junctions between thick film circuit 31 and mounting fingers 80. The discrete circuit components 24, 26, 27 and 33 on the other side of substrate 38 as shown in FIG. 2 have lead wires passing through appropriately located holes in the substrate and are electrically and mechanically connected to the deposited circuit elements of the thick film circuit by a plurality of solder connections 28, some of which are omitted in FIG. 3 for clarity. Shield 32 is similarly soldered at selected points 29 to conductive elements of thick film circuit 31. Lead wires 18, mentioned earlier are connected to a number of connection pads 42 by solder connections. The deposited resistive, capacitive and conductive components are not visible in FIG. 3 because of a glass protective sealant covering the thick film circuit, with the exception of areas surrounding the solder connections 28, 29 and 59.

The mounting of the discrete components and shields as described allows the use of automated assembly and soldering techniques similar to those currently used for printed circuit boards. Temperature induced stresses in the brittle substrate during soldering are substantially reduced by preheating the substrate and components to a temperature close to the solder temperature. This "preheating" raises the temperature of the substrate slowly, avoiding the creation of abrupt temperature gradients, and consequent stresses, in the substrate. Shields 32 and UHF subchassis 21 may be assembled to thick film circuit 31 at any point during tuner assembly. However, it is economically advantageous to preassemble the shield and UHF subchassis to the thick film circuit thereby allowing them to be soldered during the automated process. The resulting subassembly is then placed within and soldered to housing 10 at a number of points. As will be explained in detail later, during this assembly stresses resulting from moderate bending of the shields and subchassis required to fit them within the housing are absorbed by the resilient supports preventing damage to the substrate. Since the surface having deposited circuit elements is subjected to the solder, the integrity of the glass seal must be maintained during the heating and cooling cycles. This may be accomplished by applying a number of sealant layers each having slightly different temperature coefficients of expansion thereby producing a gradation of thermal stresses and maintain seal integrity.

Figure 4:
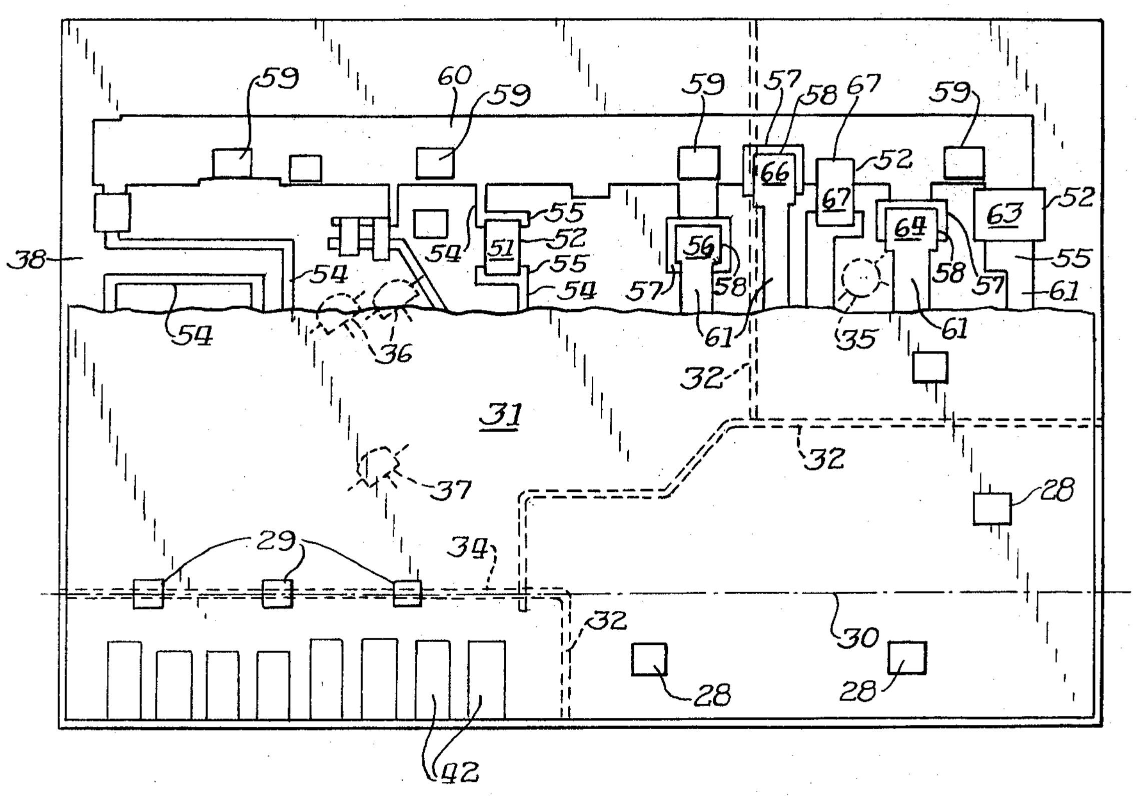
FIG. 4 is an enlarged view of the VHF thick film circuit shown in FIG. 3 partially sectioned for clarity.

In FIG. 4, a portion of the glass sealant layer is broken away to show details of some of the thick film circuitry. The thick film integrated circuit consists of nonconductive alumina substrate 38 upon which resistive and capacitive components, together with their interconnections or conductive elements, are formed by depositing appropriate layers of conductive, resistive and dielectric material in predetermined patterns. For example, a resistor 51 is formed by a deposited layer of resistive material 52 connecting two areas of conductive material 55. A capacitor 56 is formed by alternating layers of conductive material, defining plates 58, with a layer of dielectric material 57. The circuit components thus formed are connected to other circuit components by conductive elements such as conductive elements 54 and 61. As is well known in the art, the resistance of such deposited resistors may be trimmed by a laser beam to the desired value with great precision making it advantageous to use deposited resistors in circuit areas requiring great precision. Capacitors, however, are not practically trimmable and, as a result, discrete capacitors are used in areas requiring great precision.

A large area of deposited conductive material forms the ground plane 60, mentioned earlier, for the VHF tuner circuitry. As is well known, effective grounding of the high frequency tuner circuitry is essential to proper tuner performance. The resistance of the ground plane should be as low as possible. Unfortunately, the conductive material used in thick film integrated circuitry is generally palladium silver, which has much too high a resistivity for effective grounding at tuner frequencies. Therefore, the tuner includes an external metallic ground element connected in parallel with ground plane 60. Connection of the external ground element along the ground plane presents special problems associated with the brittle substrate material.

While any separate ground element may be used, an especially attractive arrangement results from using the metal UHF subchassis 21 as the external ground element for the VHF thick film circuitry. UHF subchassis 21 is, therefore, connected to ground plane 60 at a number of points 59 and provides a low resistance shunt. As previously mentioned, the RF amplifier and mixer stages (including transistor 35 and transistors 36, respectively—shown by dashed outlines in FIG. 4) are located in a straight line configuration in close proximity to the ground plane. This arrangement insures that the ground currents of the RF amplifier and mixer stages are isolated from each other and reduces the possibility of undesired signal coupling which can result in either a reduction in gain or spurious oscillation. The deposited components in the RF amplifier and mixer stages are subject to high frequency currents and special techniques are used in constructing these components. For example, components carrying high frequency currents having a grounded terminal are positioned with that terminal defined by the ground plane.

Another important aspect of thick film tuner circuitry is the phenomenon of "skin effect." Briefly, skin effect is the term applied to the fact that high frequency current carried by a conductor tends to travel towards the periphery of the conductor, thus reducing the conductor's effective cross-sectional area. As the frequency is increased, the effective cross-sectional area of the conductor is further reduced and increases its resistance to current flow. At signal frequencies typical of those processed by tuner circuits, skin effect is significant, causing the current to flow primarily at or near the surface of the conductor and creating resistance problems.

It will be seen that those conductive elements 61 of thick film circuit 31 (shown in FIG. 4) which carry high frequency currents are of substantially greater width than conductive elements 54 which carry low frequency currents. Capacitor 64, which carries high frequency currents, has a plate 58 connected to such an oversized conductive element 61. (Its other plate is formed by ground plane 60.) Similarly, resistors 63 and 67 carry high frequency currents and are connected to oversized conductive elements 61. Resistor 51, however, carries low frequency currents and is connected to narrower conductors 54.

The ceramic substrate material used for thick film circuits is extremely brittle and susceptible to damage by thermal or mechanical shock. Soldering an external metal ground element to the deposited ground plane 60 is unsuitable because of the possibility of fracture of the substrate. A rigid support at a number of separate points on the substrate may be used provided caution is exercised in how the substrate is confined in its totality. In accordance with this invention, the substrate is flexibly mounted to obviate the danger of breakage.

Figure 5:
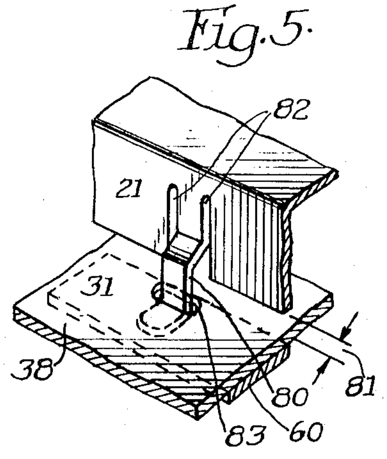
FIG. 5 is an enlarged perspective view of a portion of the disclosed tuner showing the details of the ground element connection to the ground plane.

As best shown in FIG. 5, subchassis 21 has a plurality of resilient mounting fingers 80 which pass through a corresponding plurality of holes 83 in substrate 38 and are soldered to deposited ground plane 60. The resilience of finger 80 is increased by providing a pair of relief slots 82 in subchassis 21 thus increasing the effective length of the finger. Relief slots 82 also permit finger 80 to move laterally. Thus fingers 80 "give" under stress and absorb shocks which would otherwise be transmitted to substrate 38 as well as provide the conductive connections between ground plane 60 and the external ground element, in this case UHF subchassis 21.

Returning to FIG. 4, one portion 34 of shield 32 (shown in dashed outlines) has a number of solder connections 29 attaching the shield by way of finger-like extensions on the shield to substrate 38. The connections are linearly arranged and define a hinge line 30 for the substrate. It will be seen that the connections along hinge line 30 and those at fingers 80 constitute the only means supporting substrate 38 within housing 10. Shield 32 is rigidly attached to housing 10, and supports substrate 38 by connections at solder points 29. Substrate 38 is hinged at solder points 29 and is free to move rotationally about hinge line 30 because the mounting at fingers 80 are resilient. The remainder of shield 32 is not connected to substrate 38.

The invention disclosed provides a compact, rugged and easy to manufacture television tuner which uses thick film integrated circuitry. While a particular embodiment of the present invention has been shown and described, it will be obvious to those skilled in the art that various changes and modifications may be made without departing from the invention in its broader aspects. Accordingly, the aim in the appended claims is to cover all such changes and modifications that may fall within the true spirit and scope of the invention.

What is claimed is:

1. A television tuner including:

a thick film integrated circuit having components comprising a plurality of deposited resistive, capacitive and conductive circuit components formed by predetermined patterns of resistive, dielectric and conductive materials deposited on a nonconductive substrate;

an RF amplifier stage, a mixer stage and a local oscillator stage, each including portions of said thick film circuit components;

said thick film integrated circuit carrying high frequency currents and low frequency currents;

an elongated ground plane formed on said substrate by a large area of deposited conductive material adjacent to and in alignment with said RF amplifier and mixer stages;

the ones of said plurality of deposited circuit components carrying said high frequency currents having conductive elements connected thereto which are of larger area than other conductive elements to compensate for skin effect; and an external ground element electrically connected at a plurality of points to said ground plane.

2. A television tuner as set forth in claim 1, wherein said deposited circuit components lie on one surface of said substrate and wherein said thick film circuit includes a plurality of discrete frequency selective components mounted on said substrate.

3. A television tuner as set forth in claim 2, wherein said substrate defines a plurality of holes surrounded by conductive material and wherein said discrete components are mounted on the opposite surface of said substrate and have conductors making electrical connections to said conductive material through said holes.

4. A television tuner as set forth in claim 3, wherein said substrate comprises alumina and wherein said tuner includes means supporting said substrate for protection against mechanical and thermal shock.

5. A television tuner as set forth in claim 4, wherein said supporting means includes a plurality of finger-like extensions on said external ground element cooperating with said holes in said substrate for resiliently supporting said substrate and forming electrical connections with said ground plane.

6. A television tuner as set forth in claim 5, wherein said substrate defines a linearly arranged plurality of holes and wherein said means for resiliently supporting further includes:

a linear segmenting shield, having a plurality of finger-like extensions, cooperating with said linearly arranged plurality of holes in making mechanical connections with said substrate, the linear arrangement of connections defining a hinge line about which said substrate is rotationally movable.

7. A television tuner for converting the frequency of received signals to an intermediate frequency, said tuner including:

a thick film VHF section comprising a plurality of resistive, conductive and capacitive circuit elements formed by depositing resistive, conductive, and dielectric materials in predetermined patterns on a nonconductive substrate;

a UHF section comprising a stamped metal subchassis of essentially planar configuration forming a plurality of inductive and capacitive elements, the electrical characteristics of which are adjustable by deforming portions thereof; and means for using said stamped metal subchassis of said UHF section as an external ground element for said VHF section.

8. A television tuner as set forth in claim 7, wherein said thick film VHF section includes:

an elongated ground plane formed on said substrate by a large area of deposited conductive material, and wherein said means for using includes;

a plurality of finger-like extensions on said UHF subchassis electrically and mechanically connected to said ground plane and resiliently supporting said VHF section.

9. A television tuner as set forth in claim 8, wherein said tuner includes:

a metal housing forming an electromagnetic shield surrounding said thick film VHF section and said UHF section and having means for supporting said VHF and UHF sections.

10. A television tuner as set forth in claim 9, wherein said VHF section is pivotally mounted to said housing by a straight-line plurality of mechanical connections to said substrate defining a hinge line about which said substrate is rotationally movable.

* * * * *